United States Patent
Yamada et al.

(10) Patent No.: US 9,710,000 B2
(45) Date of Patent: Jul. 18, 2017

(54) MICROPHONE BIAS CIRCUIT

(71) Applicant: ROHM CO., LTD., Ukyo-Ku, Kyoto (JP)

(72) Inventors: Kenta Yamada, Kyoto (JP); Hirotsugu Ego, Kyoto (JP)

(73) Assignee: ROHM CO., LTD., Ukyo-Ku, Kyoto (JP)

( * ) Notice: Subject to any disclaimer, the term of this patent is extended or adjusted under 35 U.S.C. 154(b) by 1 day.

(21) Appl. No.: 14/696,998

(22) Filed: Apr. 27, 2015

(65) Prior Publication Data

US 2015/0311879 A1   Oct. 29, 2015

(30) Foreign Application Priority Data

Apr. 25, 2014 (JP) ................. 2014-092053

(51) Int. Cl.
| | | |
|---|---|---|
| *H03G 5/00* | (2006.01) | |
| *G05F 1/10* | (2006.01) | |
| *H03F 3/187* | (2006.01) | |
| *H04R 1/04* | (2006.01) | |

(52) U.S. Cl.
CPC ............. *G05F 1/10* (2013.01); *H03F 3/187* (2013.01); *H04R 1/04* (2013.01)

(58) Field of Classification Search
CPC .. H04R 1/04; H04R 3/00; H04R 3/187; G05F 1/10
See application file for complete search history.

(56) References Cited

U.S. PATENT DOCUMENTS

| | | | | |
|---|---|---|---|---|
| 5,939,867 A | * | 8/1999 | Capici ..................... | G05F 1/565 323/277 |
| 6,085,257 A | * | 7/2000 | Ducaroir ................ | G09G 5/006 345/204 |
| 2005/0218991 A1 | * | 10/2005 | Birbeck .................... | H03C 1/36 330/296 |
| 2013/0014919 A1 | * | 1/2013 | Dai ....................... | F28D 15/046 165/104.26 |
| 2013/0051582 A1 | * | 2/2013 | Kropfitsch ............... | H03F 1/56 381/111 |
| 2013/0195291 A1 | * | 8/2013 | Josefsson ................ | H02M 3/07 381/174 |
| 2013/0271307 A1 | * | 10/2013 | Kropfitsch ............. | H03G 3/002 341/158 |

FOREIGN PATENT DOCUMENTS

JP    2000236383 A    2/1999

* cited by examiner

*Primary Examiner* — Regina N Holder
(74) *Attorney, Agent, or Firm* — Cantor Colburn LLP

(57) ABSTRACT

A bias circuit supplies a bias voltage $V_{BIAS}$ to a microphone. A variable gain amplifier amplifies a reference voltage $V_{REF}$. A low-pass filter removes a high-frequency component from the output of the variable gain amplifier. A voltage follower amplifier receives the output voltage of the low-pass filter, and supplies the output voltage to the microphone.

8 Claims, 6 Drawing Sheets

500a

500b

MICROPHONE BIAS CIRCUIT

CROSS REFERENCE TO RELATED APPLICATIONS

The present invention claims priority under 35 U.S.C. §119 to Japanese Application No. 2014-092053 filed Apr. 25, 2014, the entire content of which is incorporated herein by reference.

BACKGROUND OF THE INVENTION

Field of the Invention

The present invention relates to a bias circuit that supplies a bias voltage to a microphone.

Description of the Related Art

Electronic devices having a recording function or a telephone calling function such as camcorders, digital still cameras, cellular phone terminals, tablet terminals, etc., each mount a microphone, a bias circuit that biases the microphone, and an amplifier that amplifies an electric signal output from the microphone.

FIG. 1 is a circuit diagram showing a bias circuit for a microphone investigated by the present inventor. The bias circuit 30 includes a voltage source 32 and a variable gain amplifier 34, and generates a bias voltage $V_{BIAS}$ to be supplied to the microphone 2. The output terminal of the bias circuit 30 is connected to a capacitor C1 for phase compensation. The bias voltage $V_{BIAS}$ thus generated is supplied to the microphone 2 via a resistor R1.

The voltage source 32 divides a stabilized voltage $V_{REG}$ so as to generate a reference voltage $V_{REF}$. The variable gain amplifier 34 is configured as a non-inverting amplifier. The variable gain amplifier 34 amplifies the reference voltage $V_{REF}$ with a given gain so as to output the bias voltage $V_{BIAS}$. The suitable level of the bias voltage $V_{BIAS}$ varies according to the kind of microphone 2. Thus, in order to provide the bias voltage $V_{BIAS}$ suitable for each microphone 2, the gain of the variable gain amplifier 34 is adjusted.

The microphone 2 converts an input acoustic signal into an electric signal. The AC component, which is obtained by removing the DC component from the electric signal, is input to the microphone amplifier 40 via a capacitor C2 for DC blocking. The microphone amplifier 40 amplifies such a weak electric signal. An A/D converter 42 converts the output of the microphone amplifier 40 into a digital signal. The bias circuit 30 shown in FIG. 1 cannot be recognized as a known technique. The microphone amplifier 40 and the A/D converter 42 are integrated as an audio interface circuit 4r together with the bias circuit 30.

As a result obtained by investigating the bias circuit 30 shown in FIG. 1, the present inventor has come to recognize the following problem. An unshown digital circuit is mounted as a downstream stage of the A/D converter 42. High-frequency noise that occurs due to a clock signal generated in the digital circuit contaminates the bias circuit 30 via the ground line. Specifically, as shown in FIG. 1, such noise contaminates the bias voltage $V_{BIAS}$ from the ground via contamination paths (i) through (iii). The bias voltage $V_{BIAS}$ noise is input to the microphone amplifier 40 via the capacitor C2, leading to a problem of degraded sound quality.

In particular, the noise contamination via the paths (i) and (ii) is amplified by the variable gain amplifier 34. Thus, such noise becomes a factor degrading the sound quality.

SUMMARY OF THE INVENTION

The present invention has been made in order to solve such a problem. Accordingly, it is an exemplary purpose of an embodiment of the present invention to provide a bias circuit for a microphone with improved sound quality.

In order to solve the aforementioned problem, a bias circuit according to an embodiment of the present invention is configured as a bias circuit that supplies a bias voltage to a microphone. The bias circuit comprises: a variable gain amplifier that amplifies a reference voltage; a low-pass filter that removes a high-frequency component of an output of the variable gain amplifier; and a voltage follower amplifier that receives an output voltage of the low-pass filter, and that supplies the output voltage to the microphone.

With such an embodiment, the voltage follower amplifier is arranged as a downstream stage of the variable gain amplifier. Furthermore, the filter is interposed between the variable gain amplifier and the voltage follower amplifier. Thus, such an arrangement is capable of reducing a noise component included in the bias voltage while maintaining the driving capability of the microphone at a sufficient level, thereby providing improved sound quality.

Also, the low-pass filter may have a cutoff frequency that is lower than 50 Hz. Thus, such an arrangement is capable of appropriately removing the noise component in an audio band that has an effect on the sound quality.

Also, the low-pass filter may be configured as an RC filter.

Also, the variable gain amplifier may be configured as a non-inverting amplifier.

Also, the variable gain amplifier may comprise: an operational amplifier that receives the reference voltage via a non-inverting input terminal thereof; and a variable voltage-dividing circuit that divides an output voltage of the operational amplifier with a variable dividing ratio, and that inputs the voltage thus divided to an inverting input terminal of the operational amplifier.

Another embodiment of the present invention relates to an audio interface circuit. The audio interface circuit comprises: a bias circuit according to any one of the aforementioned embodiments; a microphone amplifier that amplifies an output signal of the microphone; an A/D converter that converts an output of the microphone amplifier into a digital signal; and a digital signal processing unit that performs signal processing on the digital signal.

Also, the audio interface circuit may monolithically be integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By monolithically integrating the circuit as a single IC, such an arrangement allows the circuit area to be reduced, and allows the circuit elements to have uniform characteristics.

Yet another embodiment of the present invention relates to an electronic device. The electronic device comprises a microphone; and the aforementioned audio interface circuit.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Figure 2:
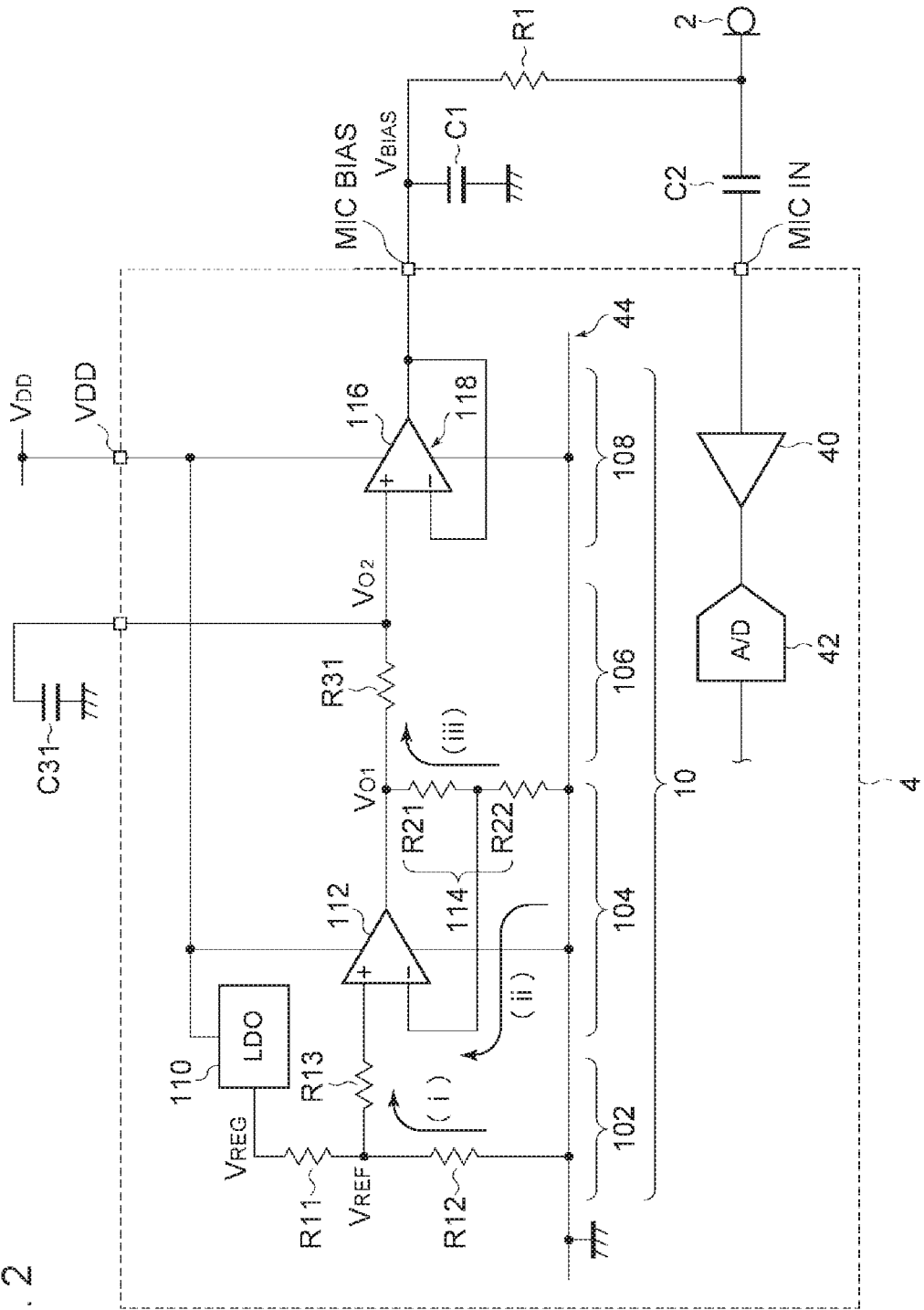
FIG. 2 is a circuit diagram showing an audio interface circuit including a bias circuit according to an embodiment.

FIG. 2 is an audio interface circuit (which will also be referred to as the "codec IC") 4 including a bias circuit 10 according to an embodiment. The audio interface circuit 4 includes a microphone amplifier 40 and an A/D converter 42 in addition to the bias circuit 10, and is configured as a function IC (Integrated Circuit) monolithically integrated on a single semiconductor substrate.

The power supply voltage $V_{DD}$ is supplied to a power supply (VDD) terminal of the audio interface circuit 4. Each circuit component included within the audio interface circuit 4 operates receiving the power supply voltage $V_{DD}$. A bias resistor R1 is arranged between a microphone bias (MICBIAS) terminal and a microphone 2. The MICBIAS terminal is connected to a phase compensation capacitor C1. Furthermore, the microphone 2 is connected to a microphone input (MICIN) terminal of the audio interface circuit 4 via a DC blocking capacitor C2.

The microphone amplifier 40 amplifies an audio electric signal input to the MICIN terminal. The A/D converter 42 converts the output of the microphone amplifier 40 into a digital audio signal.

The bias circuit 10 generates a bias voltage $V_{BIAS}$, and supplies the bias voltage $V_{BIAS}$ thus generated to the microphone 2 via the MICBIAS terminal and the resistor R1. The bias circuit 10 includes a voltage source 102, a variable gain amplifier 104, a low-pass filter 106, and a voltage follower amplifier 108.

The voltage source 102 generates a reference voltage $V_{REF}$. For example, the voltage source 102 includes an LDO (Low Drop Output) 110 and resistors R11 through R13. The LDO 110 receives the power supply voltage $V_{DD}$, and generates an internal power supply voltage $V_{REG}$ stabilized to a predetermined level. The internal power supply voltage $V_{REG}$ is also supplied to an unshown digital circuit and the like, in addition to the voltage source 102. For example, the power supply voltage $V_{DD}$ is set to 3.3 V, and the internal power supply voltage $V_{REG}$ is set to 1.8 V.

The internal power supply voltage $V_{REG}$ is divided by means of the resistors R11 and R12 so as to generate the reference voltage $V_{REF}$. The reference voltage $V_{REF}$ is supplied via the resistor R13 to the variable gain amplifier 104 configured as a downstream stage. In a case in which a first operational amplifier 112 has a sufficiently high input impedance, the resistor R13 may be omitted.

The variable gain amplifier 104 amplifies the reference voltage $V_{REF}$. The variable gain amplifier 104 is configured as a non-inverting amplifier, and includes the first operational amplifier 112 and a voltage-dividing circuit 114. The reference voltage $V_{REF}$ is input to the non-inverting input terminal (+) of the first operational amplifier 112. The voltage-dividing circuit 114 divides the output voltage $V_{O1}$ of the first operational amplifier 112 with a variable dividing ratio, and inputs the output voltage thus divided to the inverting input terminal (−) of the first operational amplifier 112. The voltage-dividing circuit 114 includes resistors R21 and R22. The dividing ratio K is represented by the following Expression (1).

$$K = R22/(R21+R22) \quad (1)$$

At least one of the resistors R21 and R22 is configured as a variable resistor. The variable gain amplifier 104 has a gain g represented by the following Expression (2).

$$g = 1/K = (R21+R22)/R22 \quad (2)$$

The low-pass filter 106 removes the high-frequency component of the output signal of the variable gain amplifier 104. The low-pass filter 106 may preferably be configured to allow only a DC component having a frequency of 0 Hz to pass through. Thus, the low-pass filter 106 preferably has a cutoff frequency fc that is as low as possible, and specifically, preferably has a cutoff frequency of 50 Hz or less. More preferably, the cutoff frequency fc is preferably lower than the lower limit of the frequency band of the microphone 2. The low-pass filter 106 is configured as an RC filter including a resistor R31 and a capacitor C31 configured as an external component.

The voltage follower amplifier 108 receives the output voltage $V_{O2}$ of the low-pass filter 106. The output voltage of the voltage follower amplifier 108 is supplied to the microphone 2 as the bias voltage $V_{BIAS}$. The voltage follower amplifier 108 includes a second operational amplifier 116 arranged such that its output terminal and its inverting input terminal are short-circuited.

The above is the configuration of the bias circuit 10. Next, description will be made regarding the operation thereof.

FIG. 2 shows the noise contamination paths (i) through (iii) in the bias circuit 10 via which noise contamination can occur from a ground line 44. The noise contamination via such paths is removed or attenuated by means of the low-pass filter 106.

Furthermore, the voltage follower amplifier 108 is arranged as a downstream stage of the low-pass filter 106. The voltage follower amplifier 108 is configured such that only a lower-side power supply terminal 118 of the second operational amplifier 116 is connected to the ground line 44. That is to say, there is no noise contamination path except for the line that connects the lower-side power supply terminal 118 and the ground line 44.

Figure 1:
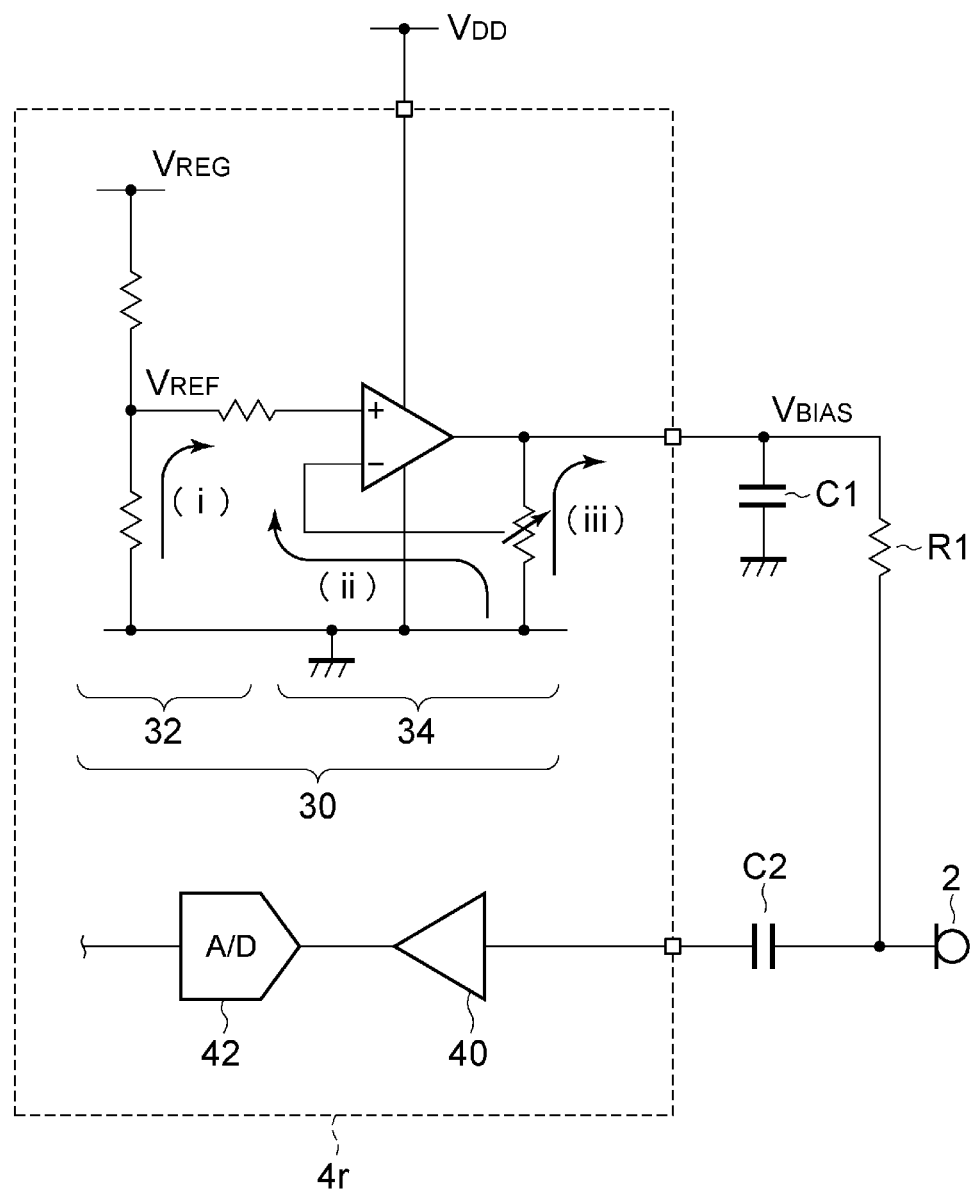
FIG. 1 is a circuit diagram showing a bias circuit for a microphone investigated by the present inventor.

The bias circuit 10 is capable of reducing noise that reaches the MICIN terminal from the ground line 44 via the bias circuit 10, as compared with the bias circuit 30 shown in FIG. 1. Thus, such an arrangement is capable of improving the S/N ratio of the input signal input to the microphone amplifier 40, thereby providing improved sound quality.

Figure 3A:
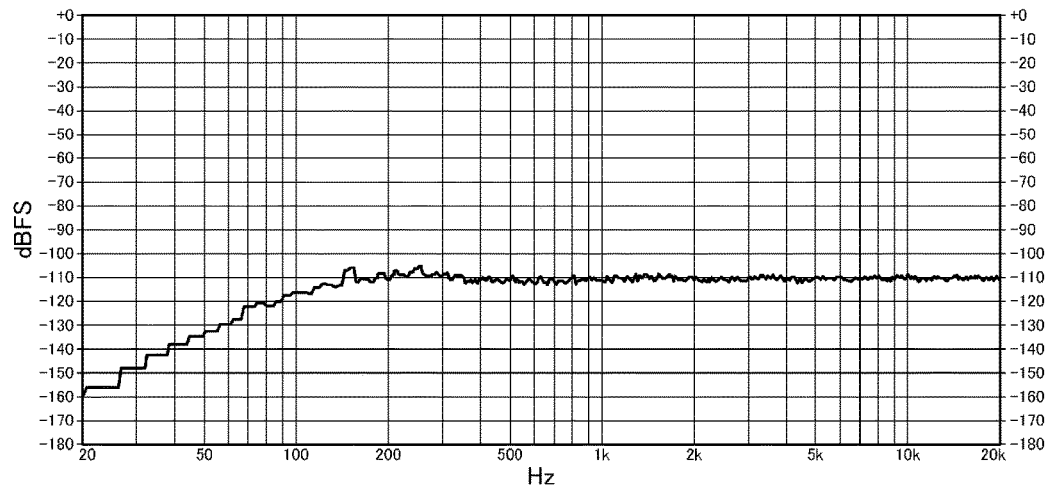
FIG. 3A shows a spectrum of the output of the audio interface circuit shown in FIG. 2.
Figure 3B:
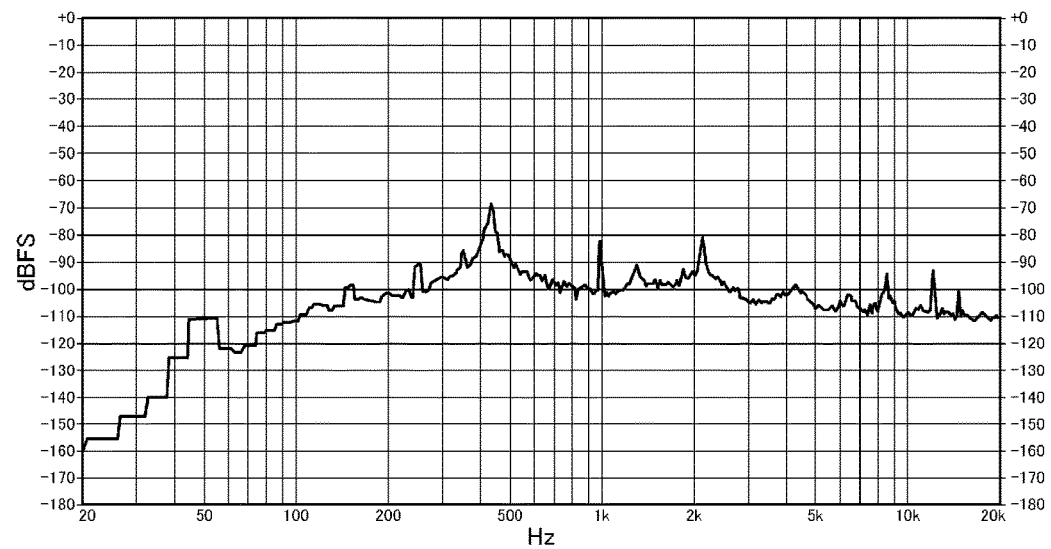
FIG. 3B shows an spectrum of the output of the audio interface circuit shown in FIG. 1.

In order to confirm the effect of the bias circuit 10 shown in FIG. 2, the spectrum of the input signal input to the MICIN terminal was measured for each of the audio interface circuits shown in FIGS. 1 and 2. FIG. 3A shows the spectrum of the output signal of the audio interface circuit shown in FIG. 2. FIG. 3B shows the spectrum of the output signal of the audio interface circuit shown in FIG. 1. As shown in FIGS. 3A and 3B, directing attention to a frequency in the vicinity of 420 Hz, for example, FIG. 3B shows a noise level of −70 dBFS (decibels relative to full scale). In contrast, FIG. 3A shows a noise level of −110 dBFS. Thus, it has been confirmed that such an arrangement provides improvement of 40 dB. As shown in FIG. 3A, in other frequencies, the bias circuit 10 shown in FIG. 2 provides a reduced noise floor level of −110 dBFS or less. Thus, it has been confirmed that such an arrangement provides an improved S/N ratio.

[Usage]

Figure 4:
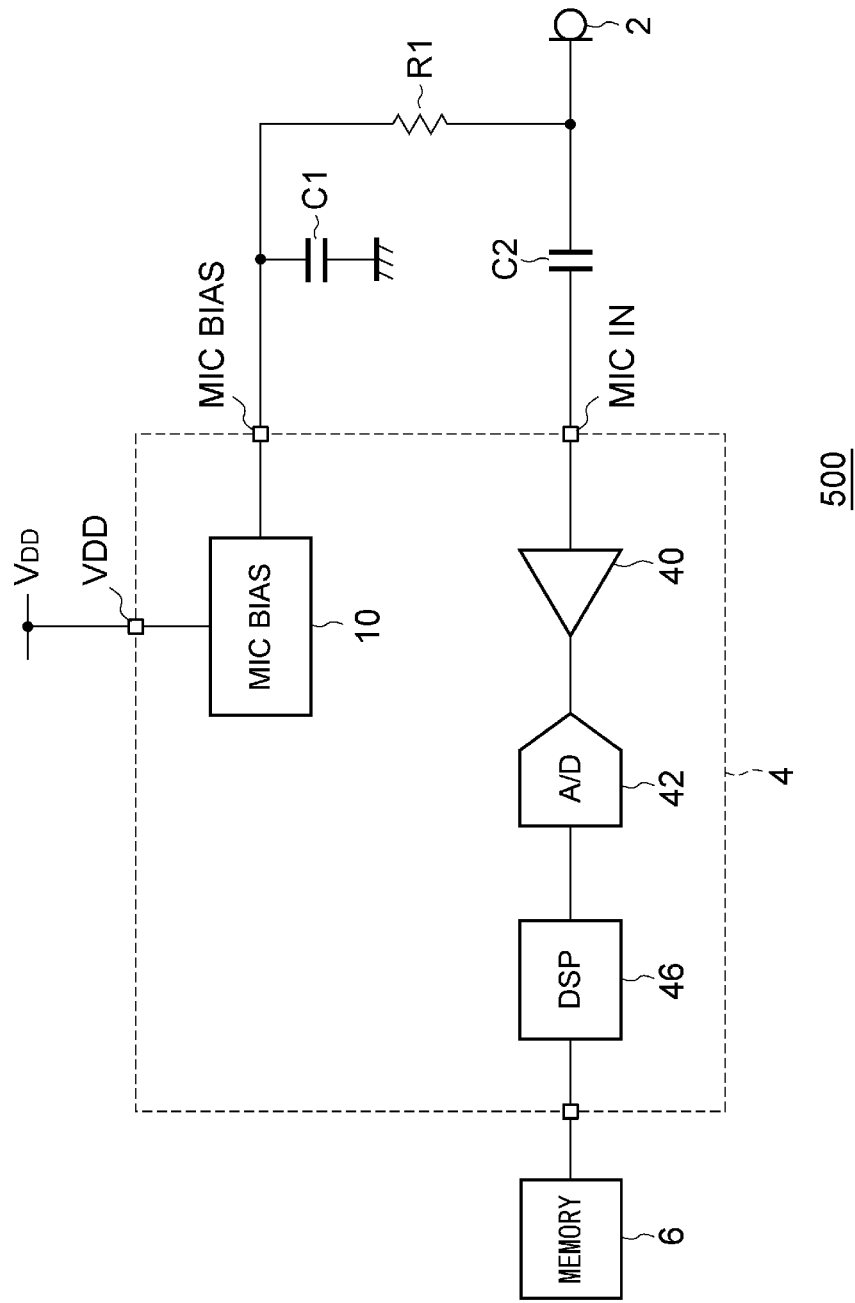
FIG. 4 is a block diagram showing an electronic device including an audio interface circuit.

FIG. 4 is a block diagram showing an electronic device 500 including an audio interface circuit 4. The electronic device 500 is configured as a device having a recording function or a telephone calling function, such as a camcorder, digital still camera, cellular phone terminal, tablet terminal, or the like. The electronic device 500 includes the microphone 2, the audio interface circuit 4, and memory 6.

The audio interface circuit 4 further includes a DSP (Digital Signal Processor) 46 arranged as a downstream stage of the A/D converter 42. The DSP 46 performs various kinds of signal processing on an audio signal converted in the form of a digital signal by the A/D converter 42. Examples of such signal processing provided by the DSP 46 include audio encoding, equalization, volume control, and the like. The audio signal thus encoded by the DSP 46 is stored in the memory 6.

Figure 5A:
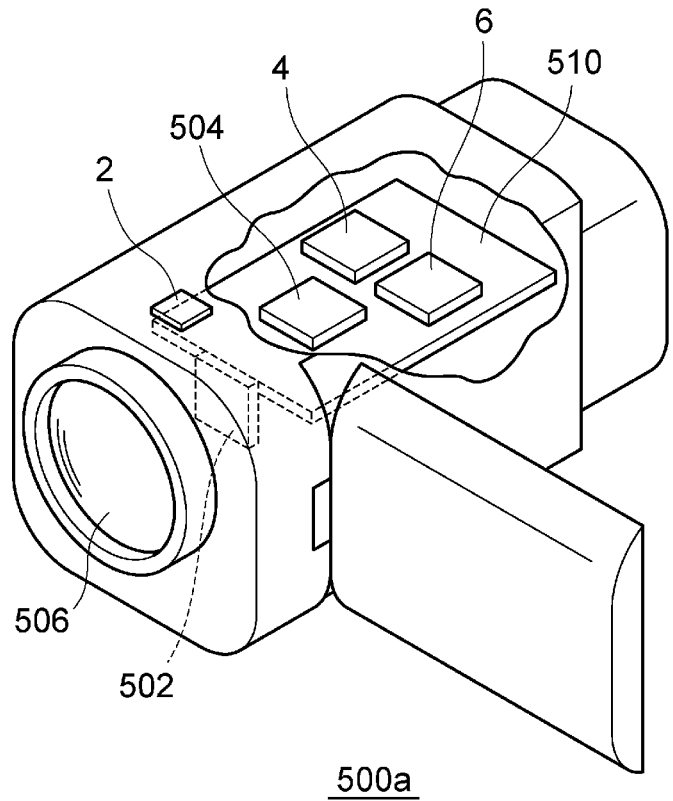
FIGS. 5A and 5B are diagrams each showing an electronic device.
Figure 5B:
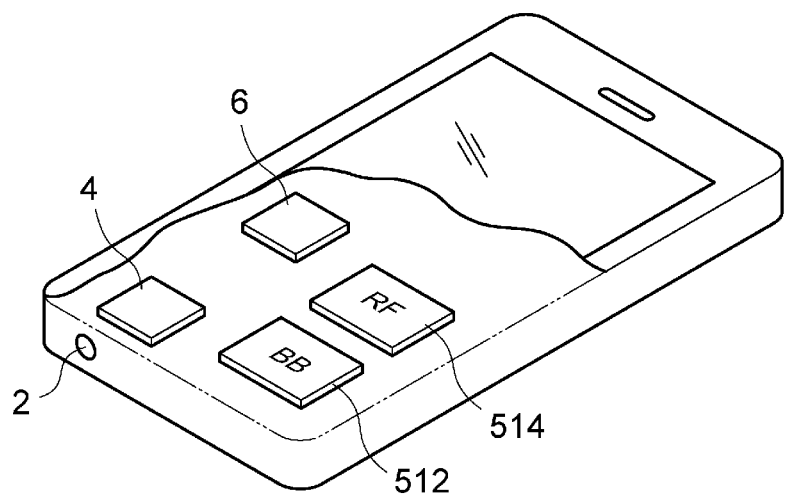

FIGS. 5A and 5B are diagrams each showing the electronic device 500. An electronic device 500a shown in FIG. 5A is configured as a camcorder, and includes an image acquisition element 502, an image processing circuit 504, a lens 506, and the like, in addition to the microphone 2, the audio interface circuit 4, and the memory 6. The audio interface circuit 4 and the image processing circuit 504 are mounted on a substrate 510.

After light passes through the lens 506, the light is converted by means of the image acquisition element 502 into an electric signal. The electric signal thus converted is subjected to image processing by means of the image processing circuit 504. The electric signal thus subjected to image processing is encoded, and the signal thus encoded is stored in the memory 6. In parallel with these steps, the microphone 2 and the audio interface circuit 4 operate together to record voice and sound.

The electronic device 500b shown in FIG. 5B is configured as a smartphone. In the electronic device 500b, the microphone 2 and the audio interface circuit 4 are used to provide a voice call. The digital audio signal generated by the audio interface circuit 4 is input to a baseband circuit 512. The baseband circuit 512 encodes the digital audio signal. An RF (Radio Frequency) circuit 514 converts the signal output from the baseband circuit 512 into a high-frequency signal, and transmits the high-frequency signal via an unshown antenna.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

The low-pass filter 106 shown in FIG. 2 may be configured as an LC filter.

[Second Modification]

Figure 6:
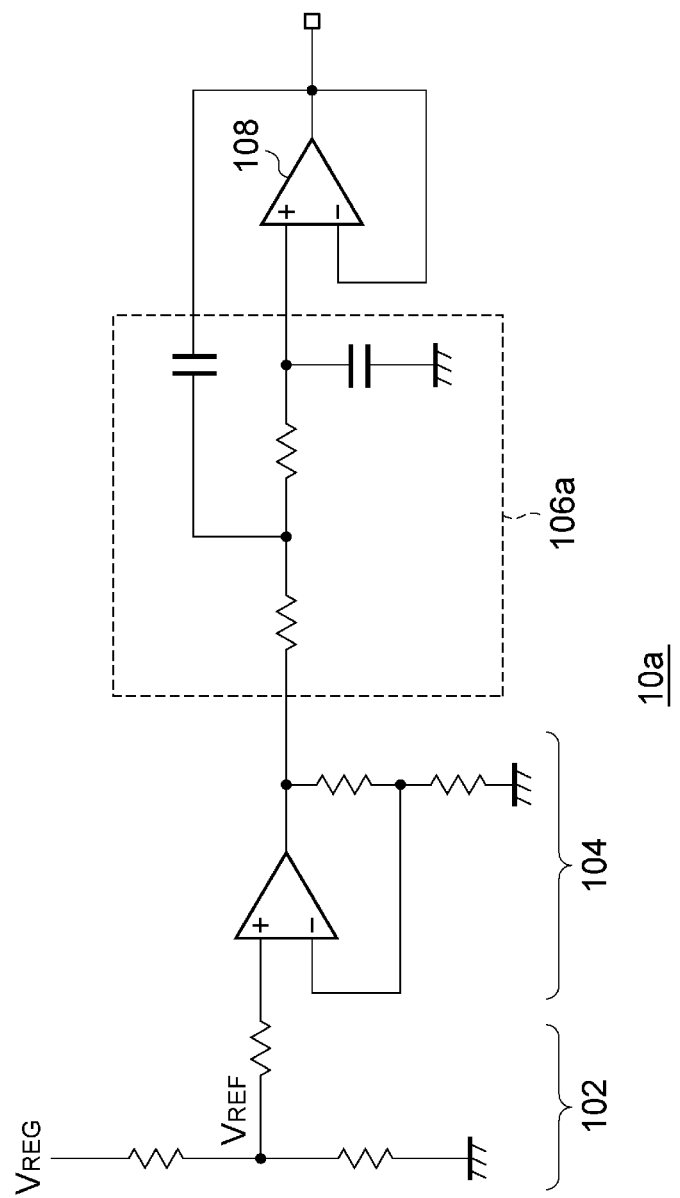
FIG. 6 is a circuit diagram showing a bias circuit according to a second modification.

The low-pass filter 106 and the voltage follower amplifier 108 may be monolithically configured as an active filter. FIG. 6 is a circuit diagram showing a bias circuit 10a according to a second modification. A low-pass filter 106a and a voltage follower amplifier 108 form a second-order active filter. It should be noted that the order of the low-pass filter is not restricted in particular. A capacitor of the low-pass filter 106a is connected as an external component to the audio interface circuit 4. Such a modification provides the same effects as those provided by the circuit shown in FIG. 2.

[Third Modification]

The variable gain amplifier 104 may be configured as an inverting amplifier. Also, the voltage source 102 may have a configuration that differs from that of a voltage-dividing circuit. For example, the voltage source 102 may be configured using a constant-voltage circuit including a Zener diode.

[Fourth Modification]

The usage of the present invention is not restricted to such audio signal processing, i.e., is not restricted to such a bias circuit for a microphone. Also, the present invention is applicable to other usages and fields that require such a low-noise bias circuit. That is to say, the present invention involves such usages and fields.

While the preferred embodiments of the present invention have been described using specific terms, such description is for illustrative purposes only, and it is to be understood that changes and variations may be made without departing from the spirit or scope of the appended claims.

What is claimed is:

1. A bias circuit structured to supply a bias voltage to a microphone, the bias circuit comprising:
    a variable gain amplifier structured to amplify a reference voltage;
    a low-pass filter structured to remove a high-frequency component of an output of the variable gain amplifier; and
    a voltage follower amplifier structured to receive an output voltage of the low-pass filter, and structured to supply the output voltage to the microphone,
    wherein the bias circuit further comprises:
    a first line;
    a second line having a potential lower than that of the first line; and a voltage source that is coupled between the first line and the second line and structured to generate the reference voltage, and wherein the variable gain amplifier comprises;
  a first operational amplifier coupled between the first line and the second line, and having its non-inverting input terminal receiving the reference voltage, its inverting input terminal and its output terminal; and
  a first resistor and a second resistor provided in series between the output terminal of the first operational amplifier and the second line, wherein a node where the first resistor and the second resistor meets is coupled to the inverting input terminal of the first operational amplifier,
and wherein the voltage follower amplifier comprises:
  a second operational amplifier coupled between the first line and the second line, and having its non-inverting input terminal receiving the output voltage of the low-pass filter and its inverting terminal directly coupled to its output terminal.

2. The bias circuit according to claim 1, wherein the low-pass filter has a cutoff frequency that is lower than 50 Hz.

3. The bias circuit according to claim 1, wherein the low-pass filter is configured as an RC filter.

4. The bias circuit according to claim 1, wherein the variable gain amplifier is configured as a non-inverting amplifier.

5. The bias circuit according to claim 1, wherein the variable gain amplifier comprises:
  an operational amplifier structured to receive the reference voltage via a non-inverting input terminal thereof; and
  a variable voltage-dividing circuit structured to divide an output voltage of the operational amplifier with a variable dividing ratio, and structured to input the voltage thus divided to an inverting input terminal of the operational amplifier.

6. An audio interface circuit comprising:
  the bias circuit according to claim 1;
  a microphone amplifier structured to amplify an output signal of the microphone;
  an A/D converter structured to convert an output of the microphone amplifier into a digital signal; and
  a digital signal processing unit structured to perform signal processing on the digital signal.

7. The audio interface circuit according to claim 6, monolithically integrated on a single semiconductor substrate.

8. An electronic device comprising:
  a microphone; and
  the audio interface circuit according to claim 6.

* * * * *